United States Patent
Chuang et al.

(10) Patent No.: US 12,167,614 B2
(45) Date of Patent: Dec. 10, 2024

(54) TECHNIQUES FOR MRAM MTJ TOP ELECTRODE TO VIA INTERFACE

(71) Applicant: Taiwan Semiconductor Manufacturing Company, Ltd., Hsin-Chu (TW)

(72) Inventors: Harry-Hak-Lay Chuang, Zhubei (TW); Hung Cho Wang, Taipei (TW); Jiunyu Tsai, Hsinchu (TW); Sheng-Huang Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 447 days.

(21) Appl. No.: 17/533,385

(22) Filed: Nov. 23, 2021

(65) Prior Publication Data

US 2022/0093684 A1   Mar. 24, 2022

Related U.S. Application Data

(62) Division of application No. 16/423,276, filed on May 28, 2019, now Pat. No. 11,189,659.

(Continued)

(51) Int. Cl.
*H10N 50/01* (2023.01)
*H10B 61/00* (2023.01)
(Continued)

(52) U.S. Cl.
CPC ............ *H10B 61/22* (2023.02); *H10N 50/01* (2023.02); *H10N 50/10* (2023.02); *H10N 50/80* (2023.02)

(58) Field of Classification Search
CPC ........ H10B 61/22; H10N 50/01; H10N 50/10; H10N 50/80
See application file for complete search history.

(56) References Cited

U.S. PATENT DOCUMENTS

| 9,634,243 | B1 | 4/2017 | Chuang et al. |
| 2004/0021188 | A1* | 2/2004 | Low ........................ H10N 50/10 257/E27.005 |

(Continued)

FOREIGN PATENT DOCUMENTS

| CN | 106298831 A | 1/2017 |
| CN | 106356448 A | 1/2017 |

OTHER PUBLICATIONS

Non-Final Office Action dated Sep. 4, 2020 for U.S. Appl. No. 16/423,276.

(Continued)

*Primary Examiner* — Moazzam Hossain
(74) *Attorney, Agent, or Firm* — Eschweiler & Potashnik, LLC

(57) ABSTRACT

Some embodiments relate to an integrated circuit including a magnetoresistive random-access memory (MRAM) cell. The integrated circuit includes a semiconductor substrate and an interconnect structure disposed over the semiconductor substrate. The interconnect structure includes metal layers that are stacked over one another with dielectric layers disposed between. The metal layers include a lower metal layer and an upper metal layer disposed over the lower metal layer. A bottom electrode is disposed over and in electrical contact with the lower metal layer. A magnetic tunneling junction (MTJ) is disposed over an upper surface of bottom electrode. A top electrode is disposed over an upper surface of the MTJ. A sidewall spacer surrounds an outer periphery of the top electrode. Less than an entirety of a top electrode surface is in direct electrical contact with a metal via connected to the upper metal layer.

20 Claims, 8 Drawing Sheets

Related U.S. Application Data

(60) Provisional application No. 62/724,217, filed on Aug. 29, 2018.

(51) Int. Cl.
  *H10N 50/10* (2023.01)
  *H10N 50/80* (2023.01)

(56) References Cited

U.S. PATENT DOCUMENTS

| | | |
|---|---|---|
| 2013/0119494 A1 | 5/2013 | Li et al. |
| 2014/0252295 A1 | 9/2014 | Liao et al. |
| 2016/0155934 A1 | 6/2016 | Hwang et al. |
| 2016/0268499 A1 | 9/2016 | You et al. |
| 2016/0268505 A1 | 9/2016 | Sung et al. |
| 2016/0380183 A1 | 12/2016 | Chuang et al. |
| 2017/0018704 A1 | 1/2017 | Chuang et al. |
| 2017/0053967 A1 | 2/2017 | Chuang et al. |
| 2017/0069827 A1 | 3/2017 | Lee et al. |
| 2017/0092693 A1* | 3/2017 | Tan ........................ H10N 50/01 |
| 2017/0170386 A1 | 6/2017 | Chuang et al. |
| 2017/0263850 A1 | 9/2017 | Ito |
| 2018/0040817 A1 | 2/2018 | Chaung et al. |
| 2019/0027679 A1 | 1/2019 | Ouellette et al. |
| 2019/0165042 A1* | 5/2019 | Clevenger .............. H10N 50/01 |
| 2020/0028067 A1* | 1/2020 | Jiang ..................... H10B 61/00 |

OTHER PUBLICATIONS

Final Office Action dated Jan. 22, 2021 for U.S. Appl. No. 16/423,276.

Non-Final Office Action dated Apr. 16, 2021 for U.S. Appl. No. 16/423,276.

Notice of Allowance dated Jul. 30, 2021 for U.S. Appl. No. 16/423,276.

* cited by examiner

TECHNIQUES FOR MRAM MTJ TOP ELECTRODE TO VIA INTERFACE

REFERENCE TO RELATED APPLICATIONS

This Application is a Divisional of U.S. application Ser. No. 16/423,276, filed on May 28, 2019, which claims the benefit of U.S. Provisional Application No. 62/724,217, filed on Aug. 29, 2018. The contents of the above-referenced Patent Applications are hereby incorporated by reference in their entirety.

BACKGROUND

Many modern day electronic devices contain electronic memory. Electronic memory may be volatile memory or non-volatile memory. Non-volatile memory is able to retain its stored data in the absence of power, whereas volatile memory loses its stored data when power is lost. Magnetoresistive random-access memory (MRAM) is one promising candidate for next generation non-volatile electronic memory due to advantages over current electronic memory. Compared to current non-volatile memory, such as flash random-access memory, MRAM typically is faster and has better endurance. Compared to current volatile memory, such as dynamic random-access memory (DRAM) and static random-access memory (SRAM), MRAM typically has similar performance and density, but lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
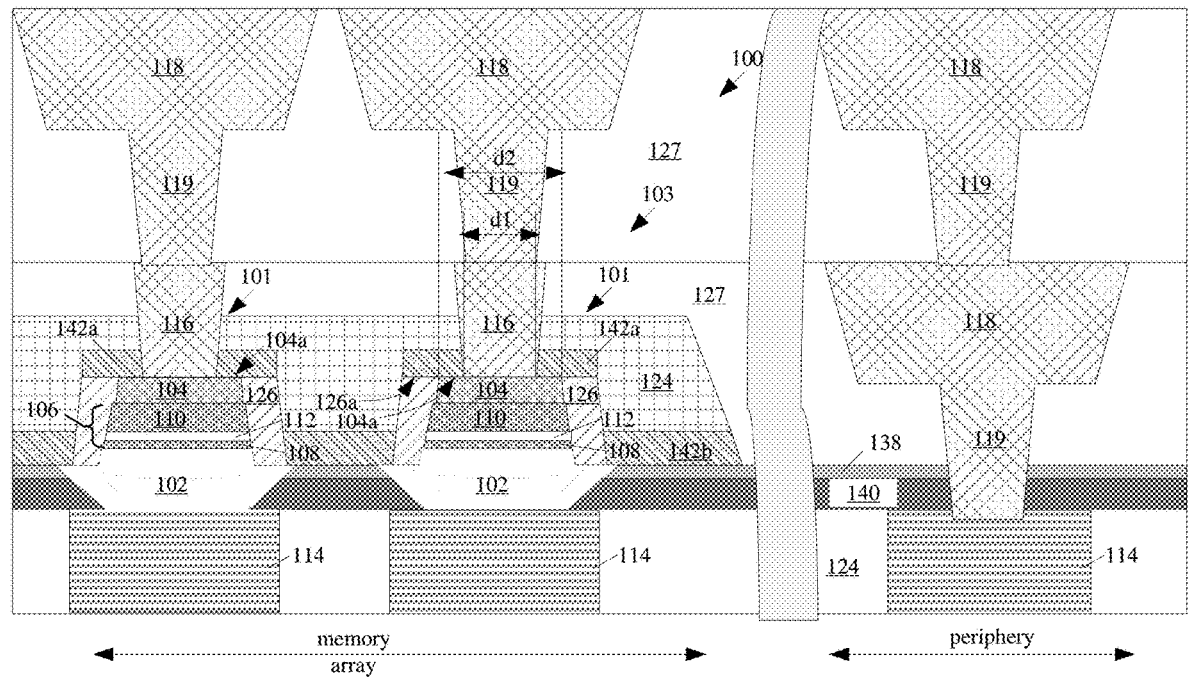
FIG. 1A illustrates a cross-sectional view of a portion of an electronic memory device including some embodiments of an MRAM cell that includes a magnetic tunneling junction (MTJ).

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetoresistive random-access memory (MRAM) cell includes top and bottom electrodes and a magnetic tunnel junction (MTJ) arranged between the top and bottom electrodes. In conventional MRAM cells, the top electrode is coupled to an overlying metal layer (e.g., metal 1, metal 2, metal 3, etc.) by a via that is coupled to the top electrode through a contact layer. The contact layer may be made of titanium or titanium nitride while the top electrode is made of tantalum. For the purposes of this description, a "via" is a relatively narrow metal connection between the MRAM cell and an overlying metal line. The via is generally more narrow that the metal line. A bottom surface of the via is nearly as wide as a top surface of the top electrode. While this top electrode arrangement has been effective, several processing steps are used to create this arrangement. The present disclosure provides for techniques for coupling the top electrode directly to a more narrow via without an intervening contact layer, and is achieved in a way that limits the number of processing steps used.

Referring to FIG. 1A, a cross-sectional view of a portion of a memory device 100 that includes a memory array region and a periphery region. The memory region includes a metal layer-to-metal layer connection arrangement 103 for a plurality of MRAM cells 101 and a metal line 118, in accordance with some embodiments. Two MRAM cells 101 (cell 1 and cell 2) are illustrated, though like reference numerals are used to describe the MRAM cells 101 for convenience. The MRAM cell 101 includes a bottom electrode 102 and a top electrode 104, which are separated from one another by a magnetic tunnel junction (MTJ) 106. The top electrode 104, the MTJ 106, and part of the bottom electrode 102 are surrounded by a sidewall spacer 126. The bottom and top electrodes 102, 104 are disposed between a lower metal layer 114 and a via 116. The sidewall spacer 126 can be made of, for example, silicon nitride, silicon carbide, $Si_3N_4$, SiON, or a combination of one or more of the foregoing. A dielectric protection layer 124 surrounds the spacer 126, and an interlayer dielectric (ILD) or intermetal dielectric (IMD) layer 127 is disposed over the dielectric protection layer 124. A dielectric liner 138, such as a silicon dioxide liner or silicon nitride liner, can conformally overlie a dielectric-protection layer 140.

The MTJ 106 includes a lower ferromagnetic electrode 108 and an upper ferromagnetic electrode 110, which are separated from one another by a tunneling barrier layer 112. In some embodiments, the lower ferromagnetic electrode 108 can have a fixed or "pinned" magnetic orientation, while the upper ferromagnetic electrode 110 has a variable or "free" magnetic orientation, which can be switched between two or more distinct magnetic polarities that each represents a different data state, such as a different binary state. In other implementations, however, the MTJ 106 can be vertically "flipped", such that the lower ferromagnetic electrode 108 has a "free" magnetic orientation, while the upper ferromagnetic electrode 110 has a "pinned" magnetic orientation.

In some embodiments, the sidewall spacer 126 includes a top spacer surface which is at approximately the same height as a top electrode surface 104a of the top electrode 104. A portion of an etch stop layer 142a remains disposed atop the spacer 126 and around an outer periphery of the via 116. The width of the etch stop layer 142a is in part controlled by a width of the spacer, which supports the etch stop layer 142a when it is deposited. A lower portion of the etch stop layer 142b can be seen extending outward from a bottom of the sidewall spacer 126. The etch stop layer 142a, 142b can be made of silicon carbide (SiC) in some embodiments. When the etch stop layer 142a' is etched to form an opening for the via 116, the opening does not extend beyond the etch stop layer 142a, thereby confining the via 116 to the region above the MRAM cell 101. The upper portion of the etch stop layer 142a' can include a central region directly over (and in some cases in direct contact with) the top electrode 104, and a peripheral region that tapers or slants downward over the spacer 126.

An advantage to depositing the etch stop layer 142a' on top of the top electrode 104 is that the etch stop layer 142a' may replace the titanium/titanium nitride layer that, in some processes, is deposited on top of the top electrode 104 to prevent oxidation and remains as a contact disposed between the via and the top electrode. This titanium/titanium nitride layer is removed by a subsequent photo/etch step. Accordingly, the use of the etch stop layer 142a and providing a direct contact between the via 116 and the top electrode 104 does away with the need for the titanium/titanium nitride contact, saving processing steps and cost. In some embodiments, the top electrode 104 is made of tungsten or titanium nitride to facilitate a direct connection between the top electrode and the via 116.

Figure 1B:
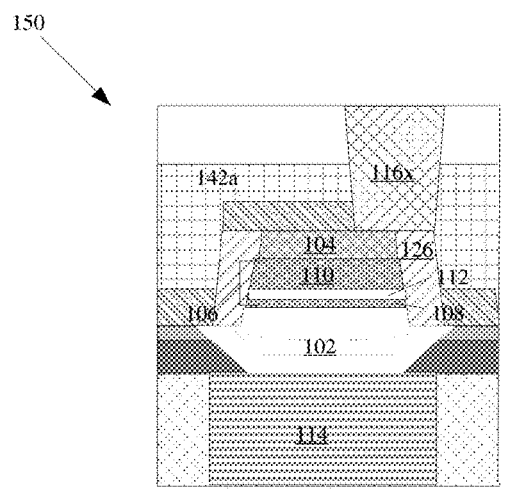
FIG. 1B illustrates a cross-sectional view of an MRAM cell illustrating a misalignment between a via and a top electrode of the MRAM cell.

A bottom surface of the via 116 has a width d1 which is significantly narrower than a width d2 of the top electrode 104. The via 116 is connected to a second via 119 which is in turn connected to upper metal line 118. The upper metal line 118 can extend into the plane of the cross-sectional view (e.g., into the paper of FIG. 1A) to provide a connecting path to other devices in the memory array and/or periphery, while the via 116 is pillar-like (e.g., square or circular) and couples only the top electrode 104 and the second via 119. FIG. 1B illustrates schematically how variations in the position of a via 116x can cause a misalignment with respect to the top electrode 104 in some embodiments.

Returning to FIG. 1A, the MRAM cells 101 are connected to the upper metal layer 118 by way of the narrow via 116 and the via 119 associated with the upper metal layer 118. This narrow via 116 reduces the amount of metal used in the connection as compared to using a wider via or jumper. In some embodiments, a bottom surface of the via 116 meets at a planar interface with less than an entirety of a top surface of the top electrode. It can be seen in FIG. 1A that the use of the narrow via 116 in direct connection with the top electrode 104 can result in an overall height of the MRAM cell 101 that is more easily compatible with back-end-of-line (BEOL) process flows.

Figure 2:
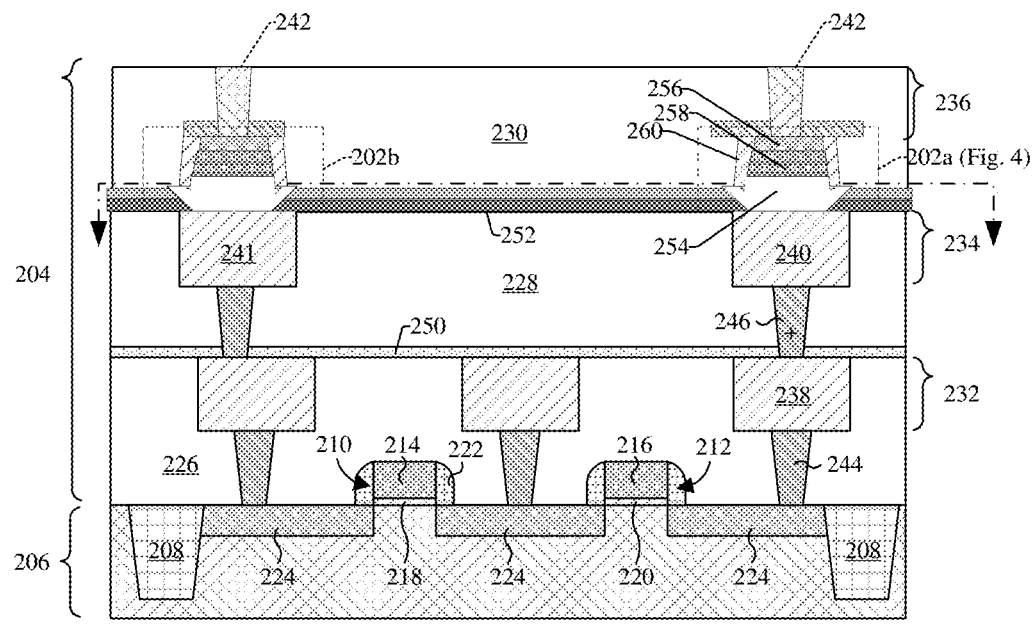
FIG. 2 illustrates a cross-sectional view of some embodiments of an integrated circuit including MRAM cells.

FIG. 2 illustrates a cross sectional view of some embodiments of an integrated circuit 200, which includes MRAM cells 202a, 202b disposed in an interconnect structure 204 of the integrated circuit 200. The integrated circuit 200 includes a substrate 206. The substrate 206 may be, for example, a bulk substrate (e.g., a bulk silicon substrate) or a silicon-on-insulator (SOI) substrate. The illustrated embodiment depicts one or more shallow trench isolation (STI) regions 208, which may include a dielectric-filled trench within the substrate 206.

Two word line transistors 210, 212 are disposed between the STI regions 208. The word line transistors 210, 212 include word line gate electrodes 214, 216, respectively; word line gate dielectrics 218, 220, respectively; word line sidewall spacers 222; and source/drain regions 224. The source/drain regions 224 are disposed within the substrate 206 between the word line gate electrodes 214, 216 and the STI regions 208, and are doped to have a first conductivity type which is opposite a second conductivity type of a channel region under the gate dielectrics 218, 220, respectively. The word line gate electrodes 214, 216 may be, for example, doped polysilicon or a metal, such as aluminum, copper, or combinations thereof. The word line gate dielectrics 218, 220 may be, for example, an oxide, such as silicon dioxide, or a high-κ dielectric material. The word line sidewall spacers 222 can be made of silicon nitride (e.g., $Si_3N_4$), for example.

The interconnect structure 204 is arranged over the substrate 206 and couples devices (e.g., transistors 210, 212) to one another. The interconnect structure 204 includes a plurality of IMD layers 226, 228, 230, and a plurality of metallization layers 232, 234, 236 which are layered over one another in alternating fashion. The IMD layers 226, 228, 230 may be made, for example, of a low κ dielectric, such as un-doped silicate glass, or an oxide, such as silicon dioxide, or an extreme low κ dielectric layer. The metallization layers 232, 234, 236 include metal lines 238, 240, 241, which are formed within trenches, and which may be made of a metal, such as copper or aluminum. Contacts 244 extend from the bottom metallization layer 232 to the source/drain regions 224 and/or gate electrodes 214, 216; and vias 246 extend between the metallization layers 232, 234, 236. The contacts 244 and the vias 246 extend through dielectric-protection layers 250, 252 (which can be made of dielectric material and can act as etch stop layers during manufacturing). The dielectric-protection layers 250, 252 may be made of an extreme low-κ dielectric material, such as SiC, for example. The contacts 244 and the vias 246, 248 may be made of a metal, such as copper or tungsten, for example.

MRAM cells 202a, 202b, which are configured to store respective data states, are arranged within the interconnect structure 204 between neighboring metal layers. The MRAM cell 202a includes a bottom electrode 254 and a top electrode 256, which are made of conductive material. Between its top and bottom electrodes 256, 254, MRAM cell 202a includes an MTJ 258. MRAM cell 202a also includes a sidewall spacer 260. A via 242 has a lowermost surface that is co-planar with and in direct electrical contact with (e.g., ohmically coupled to) a top surface of top electrode 256. The via 242 electrically connects the top electrode 256 to an upper metal layer (not shown, see FIG. 1A).

Figure 3:
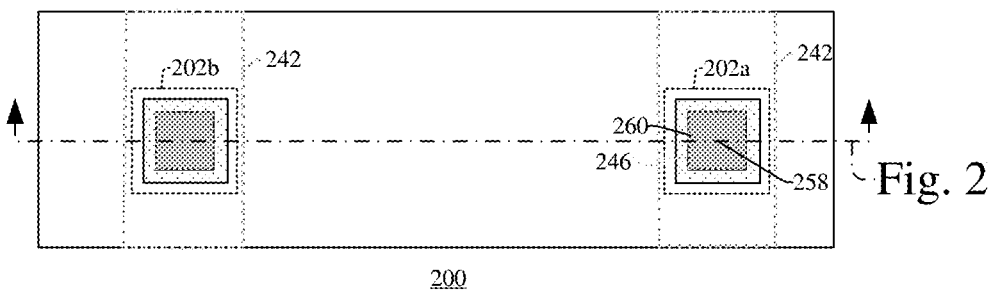
FIG. 3 illustrates a top view of some embodiments of FIG. 2's integrated circuit including MRAM cells.

FIG. 3 depicts some embodiments of a top view of FIG. 2's integrated circuit 200 as indicated in the cut-away lines shown in FIGS. 2-3. As can be seen, the MRAM cells 202a, 202b can have a square, rectangular, or circular shape when viewed from above in some embodiments. In other embodiments, however, for example due to practicalities of many etch processes, the corners of the illustrated square shape can become rounded, resulting in MRAM cells 202a, 202b having a square or rectangular shape with rounded corners, or having a circular or oval shape. The MRAM cells 202a, 202b are arranged over metal lines 240, 241, respectively, and have top electrodes 256 in direct electrical connection with the metal lines 242, respectively, without vias or contacts there between.

Figure 4:
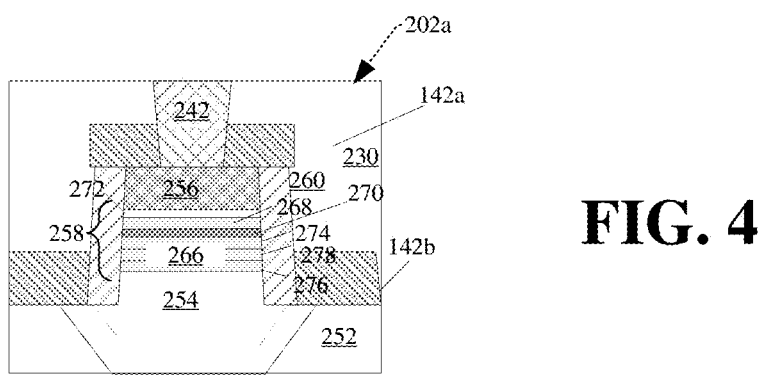
FIG. 4 illustrates an enlarged cross-sectional view an MRAM cell of FIG. 2's integrated circuit.

Referring now to FIG. 4, an enlarged cross-sectional view of FIG. 2's MRAM cell 202a is provided. As shown, the MRAM cell 202a includes bottom electrode 254 and top electrode 256 with MTJ 258 disposed between the bottom electrode 254 and top electrode 256. The bottom electrode 254 extends downwardly through in an opening in the dielectric-protection layer 252 to make electrical contact with underlying metal line 240 (not shown).

In the illustrated embodiment, the MTJ 258 includes a lower ferromagnetic electrode 266 (which can have a pinned magnetic orientation) and an upper ferromagnetic electrode 268 (which can have a free magnetic orientation). A tunneling barrier layer 270 is disposed between the lower and upper ferromagnetic electrodes 266, 268; and a capping layer 272 is disposed over the upper ferromagnetic electrode 268. The lower ferromagnetic electrode 266 can be a synthetic anti-ferromagnetic (SAF) structure that includes a top pinned ferromagnetic layer 274, a bottom pinned ferromagnetic layer 276, and a metal layer 278 sandwiched between the top and bottom pinned ferromagnetic layers 274, 276.

In some embodiments, the upper ferromagnetic electrode 268 comprises Fe, Co, Ni, FeCo, CoNi, CoFeB, FeB, FePt, FePd, or the like. In some embodiments, the capping layer 272 comprises $WO_2$, NiO, MgO, $Al_2O_3$, $Ta_2O_5$, $MoO_2$, $TiO_2$, GdO, Al, Mg, Ta, Ru, or the like. In some embodiments, the tunneling barrier layer 270 provides electrical isolation between the upper ferromagnetic electrode 268 and the lower ferromagnetic electrode 266, while still allowing electrons to tunnel through the tunneling barrier layer 270 under proper conditions. The tunneling barrier layer 270 may comprise, for example, magnesium oxide (MgO), aluminum oxide (e.g., $Al_2O_3$), NiO, GdO, $Ta_2O_5$, $MoO_2$, $TiO_2$, $WO_2$, or the like.

In operation, the variable magnetic polarity of the upper (e.g., free) ferromagnetic electrode 268 is typically read by measuring the resistance of the MTJ 258. Due to the magnetic tunnel effect, the resistance of the MTJ 258 changes with the variable magnetic polarity. Further, in operation, the variable magnetic polarity is typically changed or toggled using the spin-transfer torque (STT) effect. According to the STT effect, current is passed across the MTJ 258 to induce a flow of electrons from the lower (e.g., pinned) ferromagnetic electrode 266 to the upper (e.g., free) ferromagnetic electrode 268. As electrons pass through the lower ferromagnetic electrode 266, the spins of the electrons are polarized. When the spin-polarized electrons reach the upper ferromagnetic electrode 268, the spin-polarized electrons apply a torque to the variable magnetic polarity and toggle the state of the free ferromagnetic electrode (e.g., top electrode 268). Alternative approaches to reading or changing the variable magnetic polarity are also amenable. For example, in some alternate approaches magnetization polarities of the pinned and/or free ferromagnetic electrodes 266/268 are perpendicular to an interface between the tunneling barrier layer 270 and the pinned and/or free ferromagnetic electrode 266/268, making the MTJ 258 a perpendicular MTJ.

Advantageously, because the top electrode 256 itself is in direct electrical contact with the via 242 without an intervening contact, the overall height of the MRAM cells 202a, 202b can be reduced relative to previous approaches. Compared to previous approaches, this reduced height makes the MRAM cells 202a, 202b more easily compatible with BEOL process flows. Thus, formation of MRAM cells 202a, 202b provides better MRAM operations with reduced manufacturing cost due to eliminating the processing associated with forming a contact between the top electrode 256 and the via 242. Further, because a bottom surface of the via 242 is not as wide as the top surface of the top electrode, the amount of metal can be reduced.

With reference to FIGS. 5A-5B, 6, 7, 8A-8B, 9, 10, 11 and 12, cross-sectional views of some embodiments of a semiconductor structure having an MRAM cell at various stages of manufacture are provided. Although FIGS. 5A-5B, 6, 7, 8A-8B, 9, 10, 11 and 12 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5A:
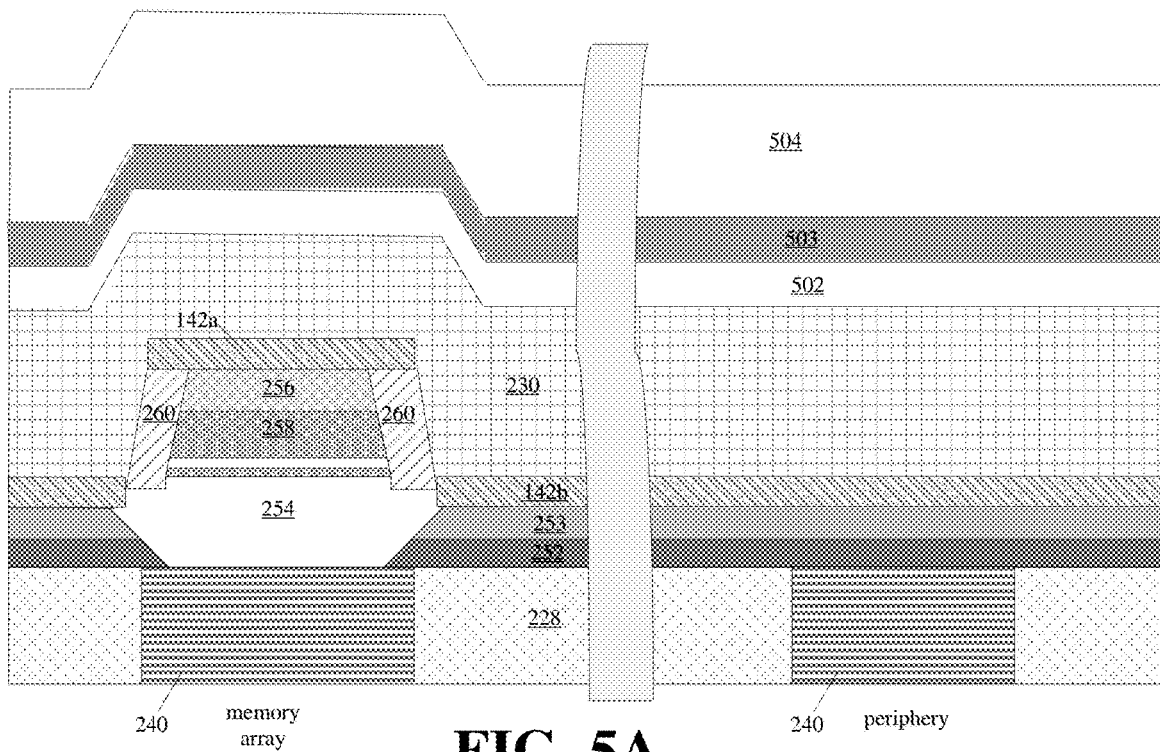
FIGS. 5A-5B, 6, 7, 8A-8B, 9, 10, 11 and 12 illustrate a series of incremental manufacturing steps as a series of cross-sectional views.

FIG. 5A illustrates a cross-sectional view of some embodiments illustrating a portion of an interconnect structure 204 disposed over a substrate (not shown in FIG. 5A, but previously shown in FIG. 2). The interconnect structure 204 includes an IMD layer 228 and a metal line 240 which extends horizontally through the IMD layer 228. The IMD layer 228 can be an oxide, such as silicon dioxide, a low-κ dielectric material, or an extreme low-κ dielectric material. The metal line 240 can be made of a metal, such as aluminum, copper, or combinations thereof. In some embodiments, the substrate can be a bulk silicon substrate or a semiconductor-on-insulator (SOI) substrate (e.g., silicon on insulator substrate). The substrate can also be a binary semiconductor substrate (e.g., GaAs), a tertiary semiconductor substrate (e.g., AlGaAs), or a higher order semiconductor substrate, for example. In many instances, the substrate manifests as a semiconductor wafer, and can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); 450 mm (17.7 inch, usually referred to as "18 inch"); for example. After processing is completed, for example after MRAM cells are formed, such a wafer can optionally be stacked with other wafers or die, and is then singulated into individual die which correspond to individual ICs.

A first dielectric-protection layer 252 is formed over IMD layer 228 and over metal line 240. In some embodiments, the first dielectric-protection layer 252 comprises SiC (silicon carbide) having a thickness of approximately 200 Angstroms. A second dielectric-protection layer 253 is formed over the first dielectric protection layer 252. In some embodiments, the second dielectric-protection layer has a different chemical composition than the first dielectric-protection layer 252, and can for example comprise SrO (strontium oxide) having a thickness of approximately 200 Angstroms. A bottom electrode layer 254 is formed over the dielectric-protection layers 252, 253, and extends downwardly through an opening in the dielectric protection layers 252, 253 to make electrical contact with an upper portion of the metal line 240. The bottom electrode layer 254 may be a conductive material, such as, for example, titanium nitride, tantalum nitride, titanium, tantalum, or a combination of one or more of the foregoing. Further, the bottom electrode layer 254 may be, for example, about 10-100 nanometers thick in some embodiments.

A magnetic tunneling junction (MTJ) stack 258 is formed over an upper surface of the bottom electrode layer 254, and a top electrode layer 256 is formed over the MTJ stack 258. The top electrode layer 256 may be a conductive material, such as, for example, titanium nitride, tantalum nitride, titanium, tantalum, tungsten, or a combination of one or more of the foregoing. Further, the top electrode layer 256 may be, for example, about 10-100 nanometers thick. Sidewalls of the MTJ 258 and/or top electrode 256 can be angled at an angle of other than 90-degrees as measured relative to a normal line passing through an upper surface of the bottom electrode 254.

A sidewall spacer 260 is formed over lateral portions of the bottom electrode 254, sidewalls of the MTJ 258, sidewalls and upper surface of the top electrode 256. In some embodiments, the sidewall spacer may be formed of, for example, silicon nitride, silicon carbide, $Si_3N_4$, SiON, or a combination of one or more of the foregoing. An etch stop layer is deposited to create a first portion of the etch stop layer 142a covering the electrode top surface and the spacer's top surface. An additional portion 142b of the etch stop layer, which may be discontinuous with respect to the first portion 142a, abuts a periphery of the bottom electrode 254.

A protective layer 230, such as a silicon oxynitride (SiON) layer or an extreme low-k dielectric layer, is then formed over the etch stop layer 142, for example, by chemical vapor deposition (CVD), plasma vapor deposition (PVD), spin on techniques, or thermal oxidation, for example. In some embodiments, a top surface of the protective layer 230 is approximately 1080 Angstroms above a surface of the second dielectric-protection layer 253. In some embodiments, chemical mechanical planarization (CMP) is then performed on the protective layer 230 to planarize an upper surface of the protective layer 230.

A CMP stop layer 502 is disposed over an upper surface of the protective layer 230. In some embodiments, the CMP stop layer 502 is made of silicon nitride and/or silicon oxynitride. In some embodiments the CMP stop layer 502 is approximately 200 Angstroms thick. A sacrificial oxide layer 503 is deposited onto the CMP stop layer 502. In some embodiments, the sacrificial oxide layer 503 is made of tetra-ethyl-ortho-silicate (TEOS). In some embodiments, the sacrificial oxide layer 503 is approximately 150 Angstroms thick. A bottom anti-reflective coating (BARC) layer 504 is deposited on the sacrificial oxide layer 503.

Figure 5B:
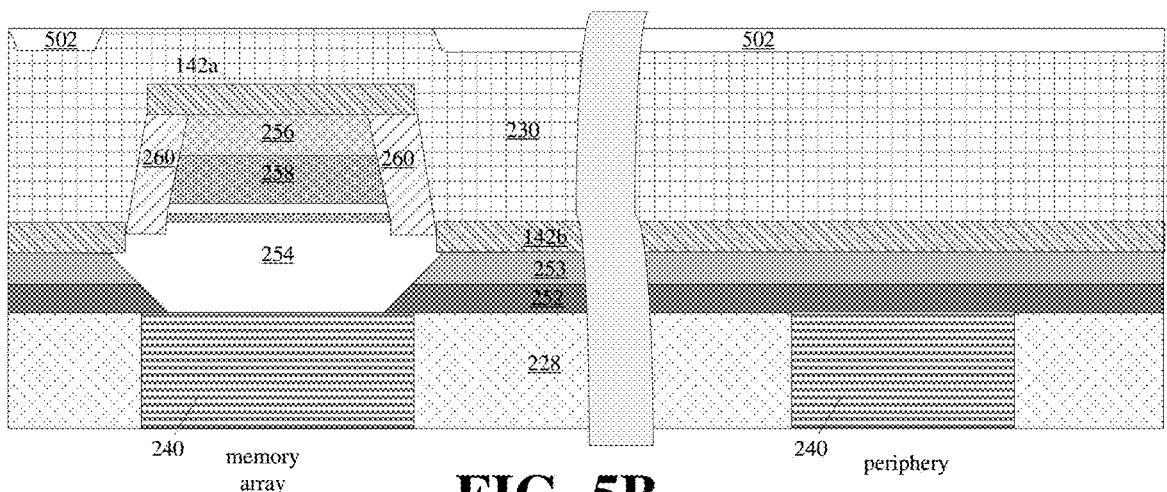

In FIG. 5B, a CMP process is performed. The CMP process stops on the remaining CMP stop layer 502 so that the CMP stop layer 502 remains except in the region above the top electrode 256.

Figure 6:
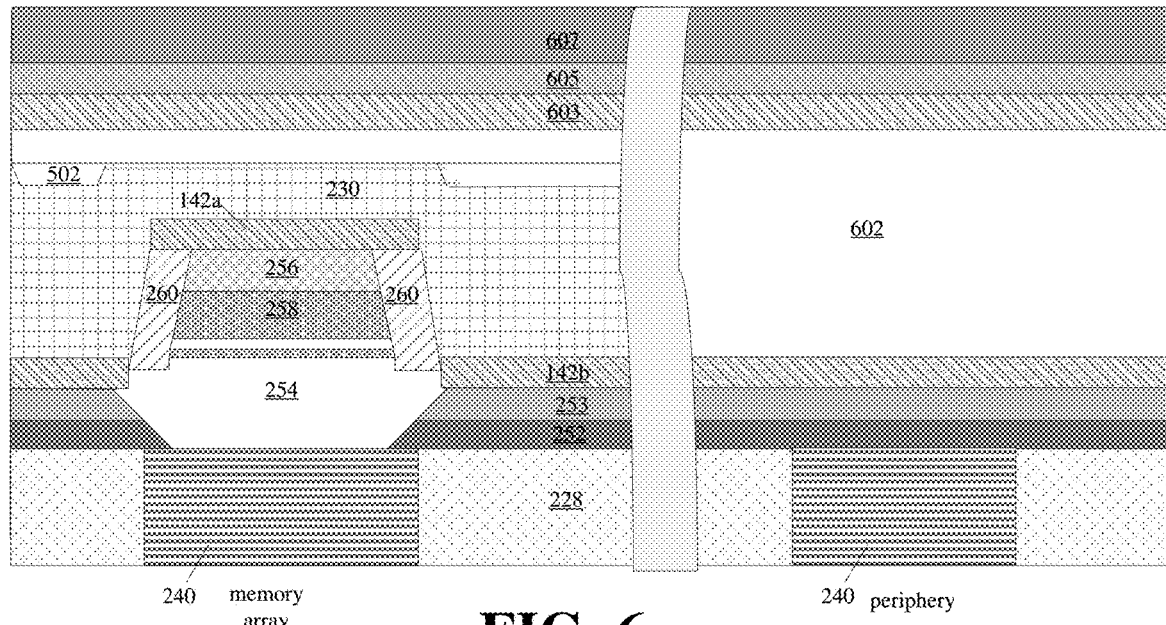

In FIG. 6, a mask (not shown) has been formed over the memory array and an etch has been performed to remove the protective layer 230 from over the peripheral area, thereby exposing the second dielectric-protection layer 253 in the periphery region. Then, an IMD or ILD layer 602 made of dielectric material, such as an oxide or extreme low-k (ELK) dielectric, is applied on top of the protective layer 230 in the memory array region and on top of the second dielectric-protection layer 253 in the periphery region. In some embodiments, the IMD or ILD layer 602 has a thickness of approximately 500 Angstroms in the memory array region and approximately 1700 Angstroms in the periphery region. An etch stop layer 603 is deposited on the IMD or ILD layer 602. In some embodiments, the etch stop layer 603 comprises tetra-ethyl-ortho-silicate (TEOS). A nitrogen free anti-reflection layer (NFARL) 605 is applied on top of the etch stop layer 603. In some embodiments, the NFARL 605 is approximately 200 Angstroms thick. A mask layer 607, such as a hard mask or photoresist mask, is applied onto the NFARL 605. In some embodiments, the mask layer 607 comprises titanium nitride (TiN) and is approximately 350 Angstroms thick.

Figure 7:
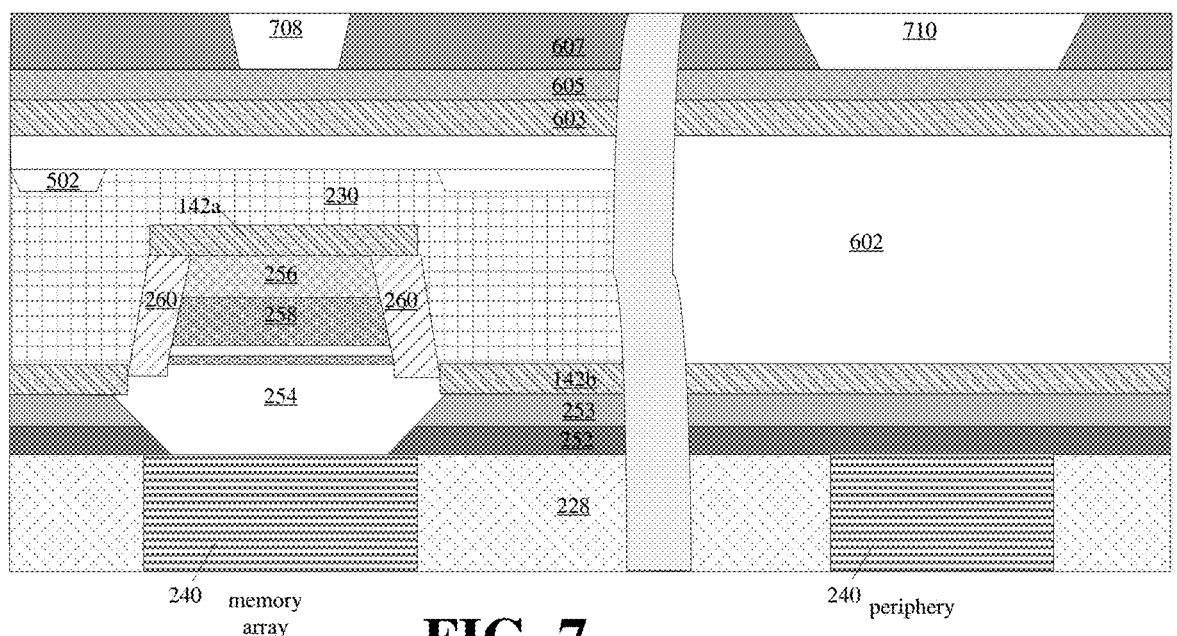

In FIG. 7 photolithography is used to pattern the mask layer 607 in the memory array region with via openings 708 that will hold a top metal layer via that will contact the top electrode 256. In the periphery region the mask layer 607 is also patterned with trench openings 710 that will be used to form trenches or openings that will hold a top metal layer line that will contact the metal line 240. In some embodiments, the trench openings 710 are wider than the via openings 708. In some embodiments, these openings can be dual-damascene openings. Because the via openings 708 and the trench openings 710 are formed in the same patterning operation, (e.g., using the same patterned mask) alignment between the via openings 708 and the trench openings 710 can be closely controlled. Improved alignment between the via openings 708 and the trench openings 710 may help reduce the misalignment between the top metal layer via that will fill the via opening 708 and the top electrode 256. This misalignment is shown in FIG. 1B.

Figure 8A:
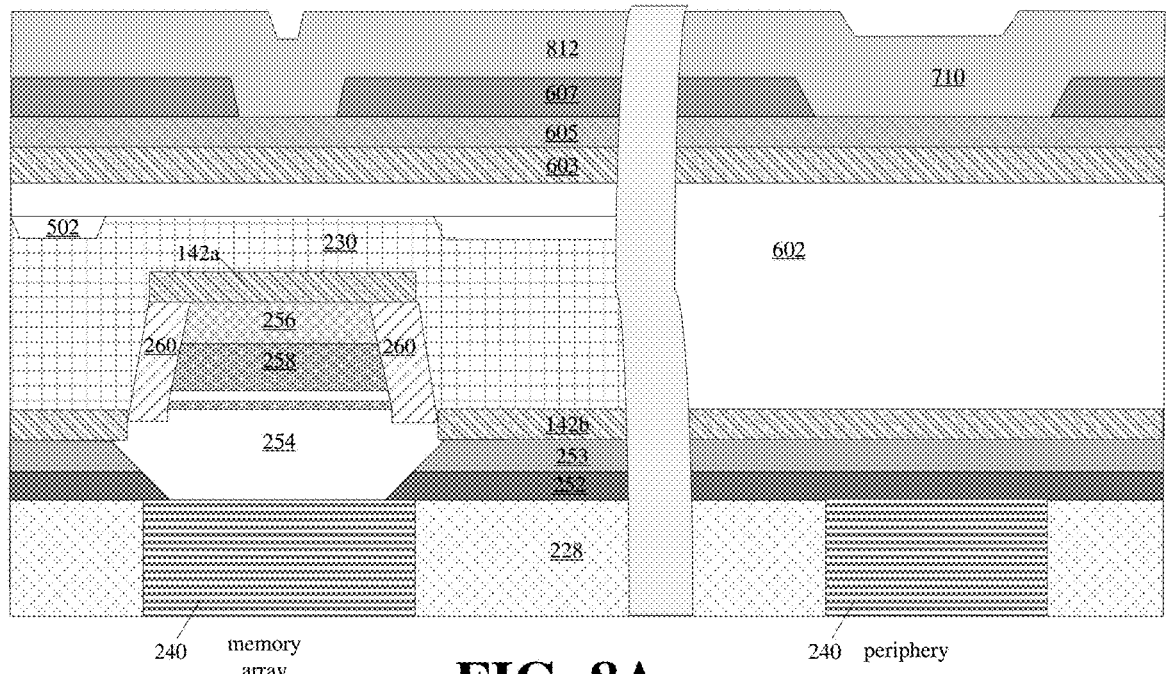
Figure 8B:
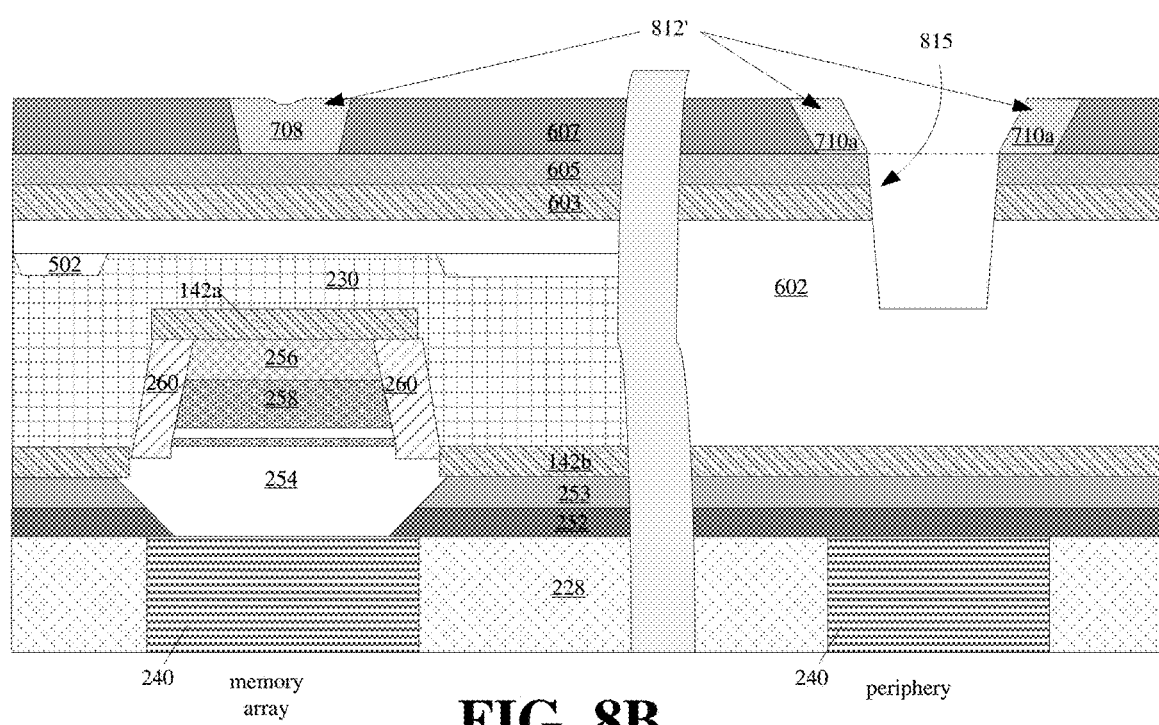

In FIG. 8A a conformal patterning layer 812, such as a silicon nitride layer or silicon oxynitride layer, for example, is deposited on top of the patterned mask layer 607. In FIG. 8B, a uniform vertical thickness of the conformal patterning layer 812 is etched away, leaving a remainder of the conformal patterning layer 812' filling the via opening 708 and forming a spacer 710a at the periphery of the trench opening 710. A first etch is performed to form an opening 815 in a central region of in the trench opening 710. The remaining conformal patterning layer 812' in the via opening 708 prevents etching of the via opening and the spacer 710a prevent etching on the periphery of the trench opening 710.

Figure 9:
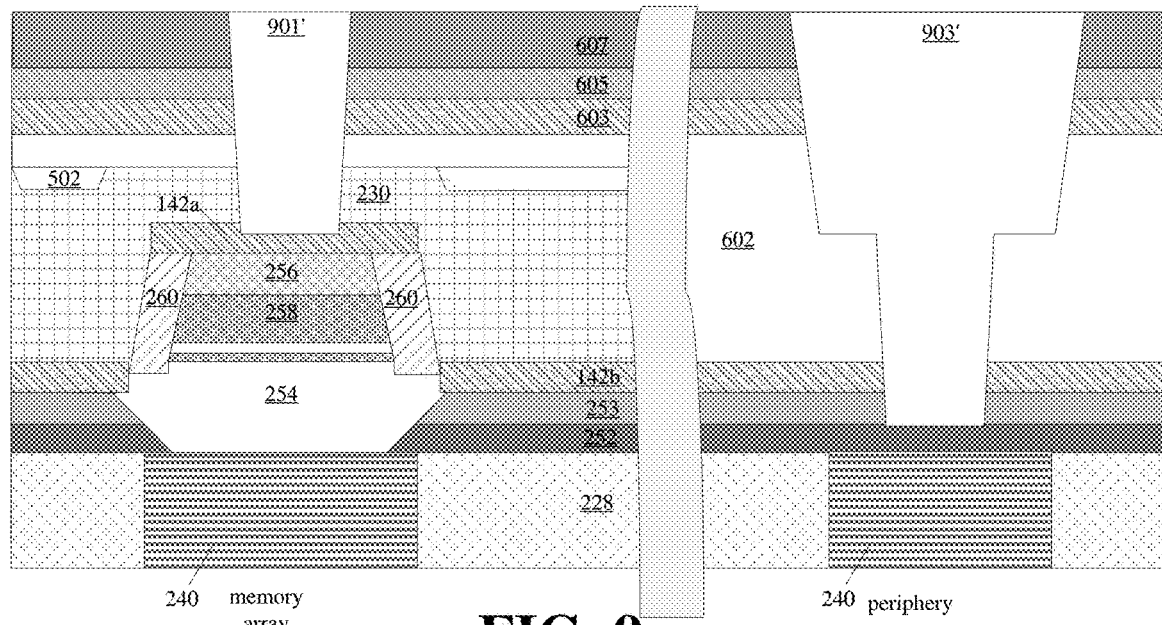

In FIG. 9 the remaining conformal patterning layer 812' is etched back using a selective etch to remove the conformal patterning layer 812' from the opening 708 and to remove the spacer 710a. After the spacer 710a has been removed and after the conformal patterning layer 812' has been removed from the opening 708, a further etch such as a highly anisotropic etch (e.g., a vertical etch, such as a dry etch) is performed to form via opening precursor 901' in the memory array region and trench opening precursor in the periphery region.

Figure 10:
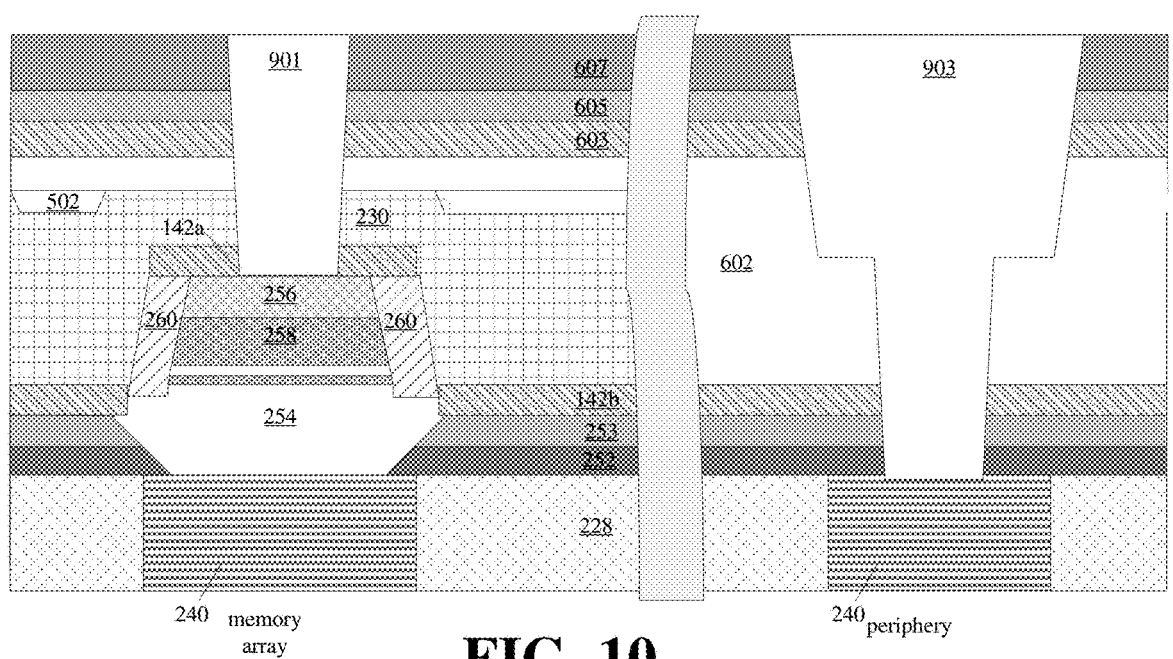

In FIG. 10 an etching process is performed to remove the etch stop layer 142a at a bottom of the via opening 901 so that the opening 901 exposes a portion of the top surface of the electrode 256. The etching process also removes the protective layer 252 at the bottom of the opening 903 so that the opening 903 exposes a top of the metal line 240.

Figure 11:
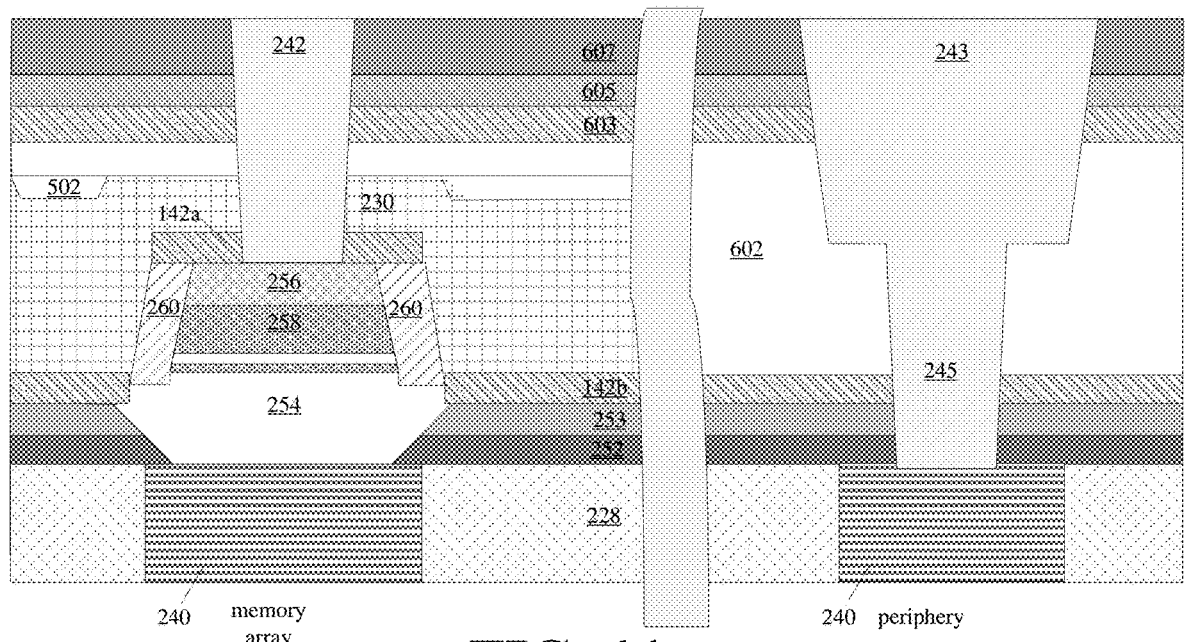

In FIG. 11 metal, such as aluminum or copper is used to fill the trenches and openings. Thus, in the memory array region, the via opening 901 is filled with a metal via 242 having a bottom surface which is in direct contact with the top surface of the top electrode 256, thereby providing an ohmic connection. In some embodiments, the bottom surface of the metal via 242 is in contact with less than an entirety of the top surface of the top electrode 256. In another region of the integrated circuit, such as in the periphery region where CMOS logic devices are formed, a metal line or jumper 243 is coupled to an underlying metal line 240 through a via 245.

Figure 12:
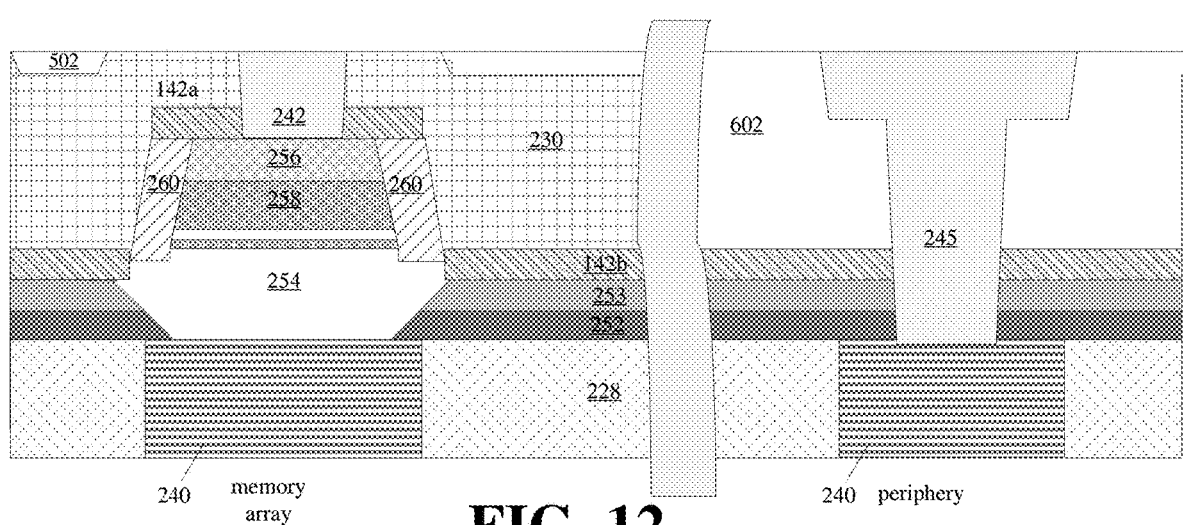

In FIG. 12, A CMP operation is then performed to planarize an upper surface of the metal lines features 242, 243 and an upper surface of the dielectric-protection layer 602, thus resulting in the structure of FIG. 12 as well as FIGS. 1A and/or 4.

Figure 13:
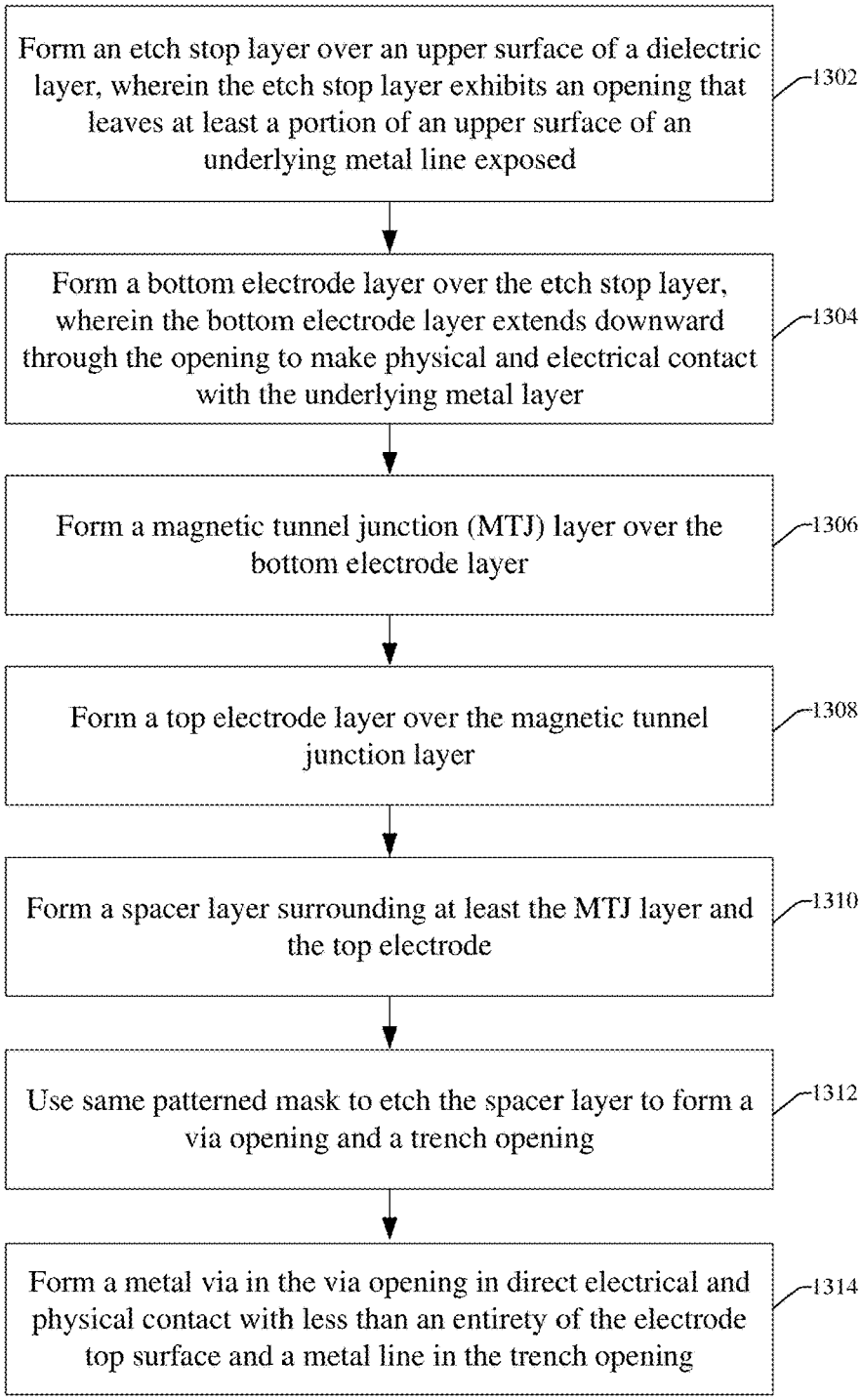
FIG. 13 illustrates a methodology in flowchart format that illustrates some embodiments of the present concept.

FIG. 13 illustrates a methodology 1300 of manufacturing a memory device comprising a memory array region including a magnetoresistive random-access memory (MRAM) cell and a periphery region in accordance with some embodiments. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Acts 1302 through 1310 can correspond, for example, to the structure previously illustrated in FIGS. 5A and 5B in some embodiments. At 1302, an etch stop layer is formed over an upper surface of a dielectric layer. The etch stop layer exhibits an opening that leaves at least a portion of an upper surface of an underlying metal line exposed. At 1304, a bottom electrode layer is formed over the etch stop layer. The bottom electrode layer extends downward through the opening to make physical and electrical contact with the underlying metal layer. At 1306, a magnetic tunnel junction (MTJ) layer is formed over the bottom electrode layer. At 1308, a top electrode layer is formed over the magnetic tunnel junction layer. At 1310, a spacer layer surrounding at least the MTJ layer and the top electrode is formed. At 1312, which can correspond to the example to previously illustrated FIGS. 6-10, a same patterned mask is used to etch the spacer layer to form a via opening that exposes less than an entirety of a top surface of the top electrode and a trench opening that exposes an upper surface of a second underlying metal line in the periphery region. At 1314, which can correspond to the example to previously illustrated FIG. 11, a metal via is formed to be in direct physical contact and electrical contact with the top surface of the top electrode and a metal line is formed in the trench opening in the periphery region.

Some embodiments relate to an integrated circuit including a magnetoresistive random-access memory (MRAM) cell. The integrated circuit includes a semiconductor substrate and an interconnect structure disposed over the semiconductor substrate. The interconnect structure includes a plurality of dielectric layers and a plurality of metal layers that are stacked over one another in alternating fashion. The plurality of metal layers include a lower metal layer and an upper metal layer disposed over the lower metal layer. A bottom electrode is disposed over and in electrical contact with the lower metal layer. A magnetic tunneling junction (MTJ) is disposed over an upper surface of the bottom electrode. A top electrode disposed over an upper surface of the MTJ and has an electrode top surface. A sidewall spacer surrounds an outer periphery of the top electrode. Less than an entirety of the top electrode surface is in direct electrical contact with a metal via which is in electrical contact with a bottom surface of the upper metal layer.

Other embodiments relate to a magnetoresistive random-access memory (MRAM) cell disposed on a semiconductor substrate. The MRAM cell includes a bottom electrode disposed over the semiconductor substrate, and a magnetic tunneling junction (MTJ) is disposed over the bottom electrode. A top electrode is disposed over an upper surface of the MTJ, wherein the top electrode has an electrode top surface. A metal via is in direct electrical contact with less than an entirety of the top electrode. The metal via is in electrical contact with a bottom surface of an upper metal layer.

A method for manufacturing a memory device comprising a memory array region including a magnetoresistive random-access memory (MRAM) cell and a periphery region. In the method, an etch stop layer is formed over an upper surface of a dielectric layer, wherein in the memory array region the etch stop layer exhibits an opening that leaves at least a portion of an upper surface of a first underlying metal line exposed. A bottom electrode layer is formed over the etch stop layer. The bottom electrode layer extends downward through the opening to physically and electrically connect to the first underlying metal line. A magnetic tunnel junction (MTJ) layer is formed over the bottom electrode layer. A top electrode is formed over the magnetic tunnel junction layer. A spacer layer is formed to surround at least the MTJ layer and the top electrode. A same patterned mask is used to etch the spacer layer to form a via opening that exposes less than an entirety of a top surface of the top electrode and to form a trench opening that exposes an upper surface of a second underlying metal line in the periphery region. A metal via is formed in the via opening in direct electrical and physical contact with the top surface of the top electrode and a metal line is formed in the trench opening in the periphery region.

It will be appreciated that in this written description, as well as in the claims below, the terms "first", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a memory device comprising a memory array region including a magnetoresistive random-access memory (MRAM) cell and a periphery region, the method including:
   forming an etch stop layer disposed over an upper surface of a dielectric layer, wherein in the memory array region the etch stop layer exhibits an opening that leaves at least a portion of an upper surface of a first underlying metal line exposed;

forming a bottom electrode layer over the etch stop layer, the bottom electrode layer extends downward through the opening to physically and electrically connect to the first underlying metal line;

forming a magnetic tunnel junction (MTJ) layer over the bottom electrode layer;

forming a top electrode over the MTJ layer;

forming a spacer layer surrounding at least the MTJ layer and the top electrode;

using a same patterned mask to etch the spacer layer to form a via opening that exposes less than an entirety of a top surface of the top electrode and a trench opening in the periphery region; and forming a metal via in the via opening in direct electrical and physical contact with the top surface of the top electrode and forming a metal line in the trench opening in the periphery region.

2. The method of claim 1, wherein the trench opening is wider than the via opening.

3. The method of claim 1, further comprising depositing a conformal patterning layer over the same patterned mask.

4. The method of claim 3 wherein the etch of the spacer layer comprises performing a first etch to remove a uniform vertical thickness of the conformal patterning layer to expose a central region within the trench opening and a spacer formed of remaining conformal patterning layer around a periphery of the trench opening.

5. The method of claim 4, further comprising performing a second etch to create a trench opening precursor in the central region as defined by the spacer layer.

6. The method of claim 5, further comprising performing a third etch to remove the spacer layer and the remaining conformal patterning layer from the via opening.

7. The method of claim 1, wherein the same patterned mask comprises titanium nitride (TiN) and is approximately 350 Angstroms thick.

8. The method of claim 3 wherein the conformal patterning layer comprises silicon nitride or silicon oxynitride.

9. A method for manufacturing a memory device comprising a memory array region including a magnetoresistive random-access memory (MRAM) cell and a periphery region, the method including:

forming an etch stop layer disposed over an upper surface of a dielectric layer, wherein the etch stop layer extends over a first underlying metal line in the memory array region and a second underlying metal line in the periphery region;

forming a bottom electrode layer over the etch stop layer in the memory array region, the bottom electrode layer electrically coupled to the first underlying metal line;

forming a magnetic tunnel junction (MTJ) layer over the bottom electrode layer;

forming a top electrode over the MTJ layer;

forming a dielectric material over the top electrode in the memory array region and over the second underlying metal line in the periphery region; and performing an etch with a mask in place to form a first via opening that exposes the top electrode in the memory array region and to form a second via opening that concurrently exposes an upper surface of the second underlying metal line in the periphery region.

10. The method of claim 9, wherein the top electrode has a thickness of about 10 nanometers to about 100 nanometers.

11. The method of claim 9, wherein the bottom electrode layer has a thickness of about 10 nanometers to about 100 nanometers.

12. The method of claim 9, further comprising:

forming a first metal via in the first via opening and a second metal via in the second via opening, the first metal via being in direct electrical and physical contact with the top electrode and the second metal via being in direct electrical and physical contact with the second underlying metal line in the periphery region.

13. The method of claim 12, wherein the first metal via and the second metal via are formed concurrently.

14. The method of claim 12, wherein the first metal via and the second metal via comprise aluminum or copper.

15. A method for manufacturing a memory device comprising a memory array region including magnetoresistive random-access memory (MRAM) cells and a periphery region spaced apart from the memory array region, the method including:

forming an etch stop layer disposed over an upper surface of a dielectric layer, wherein the etch stop layer extends over a first underlying metal line in the memory array region and a second underlying metal line in the periphery region;

forming a bottom electrode layer over the etch stop layer in the memory array region, the bottom electrode layer electrically coupled to the first underlying metal line;

forming a magnetic tunnel junction (MTJ) layer over the bottom electrode layer;

forming a top electrode over the MTJ layer;

forming an etch stop structure comprising a first portion disposed over a top surface of the top electrode and a second portion, which is discontinuous with the first portion, over the etch stop layer in the memory array region between neighboring MRAM cells;

forming a dielectric material over the etch stop structure in the memory array region and over the second underlying metal line in the periphery region; and performing an etch with a mask in place to form a first via opening that extends through the etch stop structure and exposes the top electrode in the memory array region and to form a second via opening that exposes an upper surface of the second underlying metal line in the periphery region.

16. The method of claim 15, further comprising:

forming a first metal via in the first via opening and a second metal via in the second via opening, the first metal via being in direct electrical and physical contact with the top electrode and the second metal via being in direct electrical and physical contact with the second underlying metal line in the periphery region.

17. The method of claim 16, wherein the first metal via and the second metal via are formed concurrently.

18. The method of claim 16, wherein the same patterned mask is used to form the first via opening and the second via opening.

19. The method of claim 18, wherein the same patterned mask is also used to form a trench opening in the periphery region prior to forming the second via opening.

20. The method of claim 19, wherein the same patterned mask comprises titanium nitride (TiN) and is approximately 350 Angstroms thick.

* * * * *